United States Patent
Hoffman et al.

(10) Patent No.: US 7,230,478 B2
(45) Date of Patent: Jun. 12, 2007

(54) METHOD AND APPARATUS FOR PHASE BALANCING OF AMPLIFIER MODULES

(75) Inventors: Gebhard Hoffman, Munich (DE); Andreas Salomon, Munich (DE)

(73) Assignee: EADS Deutschland GmbH, Ottobrunn (DE)

( * ) Notice: Subject to any disclaimer, the term of this patent is extended or adjusted under 35 U.S.C. 154(b) by 170 days.

(21) Appl. No.: 11/049,669

(22) Filed: Feb. 4, 2005

(65) Prior Publication Data
US 2005/0189991 A1  Sep. 1, 2005

(30) Foreign Application Priority Data
Feb. 7, 2004  (DE) ...................... 10 2004 006 070

(51) Int. Cl.
*H03F 3/68* (2006.01)
(52) U.S. Cl. ...................................... 330/2; 330/124 R
(58) Field of Classification Search ................... 330/2, 330/51, 124 R
See application file for complete search history.

(56) References Cited

U.S. PATENT DOCUMENTS
6,006,111 A * 12/1999 Rowland ................... 455/561

FOREIGN PATENT DOCUMENTS
DE  1 913 670  9/1970
JP  2001-94350 A  4/2001
WO  WO 01/06643 A1  1/2001

* cited by examiner

*Primary Examiner*—Steven J. Mottola
(74) *Attorney, Agent, or Firm*—Crowell & Moring LLP

(57) ABSTRACT

In a method and apparatus for of balancing the phases of a plurality of amplifier modules so as to maximize the combined power output of the amplifier modules an amplifier module is selected as a reference module with a fixed phase in a first step. In a second and subsequent steps, the phase of each of the other amplifier modules is each adjusted relative to the reference module, such that the combined power output from the respective individual amplifier module and the reference module is minimized. Finally, the phase of the reference module is rotated by 180°.

6 Claims, 2 Drawing Sheets

METHOD AND APPARATUS FOR PHASE BALANCING OF AMPLIFIER MODULES

BACKGROUND AND SUMMARY OF THE INVENTION

This application claims the priority of German patent document No. 10 2004 006 070.3, filed Feb. 7, 2004, the disclosure of which is expressly incorporated by reference herein.

The invention relates to a method and apparatus phase balancing of amplifier modules.

When the power output of several parallel connected amplifier modules is to be combined (for example, in a Wilkinson adder), the phase of the amplifier control must be balanced beforehand, so that the total power output will be the sum of the individual outputs. Conventionally, this has been done by matching the phasing of the several amplifier modules with a reference amplifier module. Balancing is performed such that the amplifier modules were produced corresponding to a model (reference amplifier module). During the manufacturing, the output phases of the individual amplifier modules are substantially adapted by virtue of constructional methods.

One disadvantage of this method is that it requires increased balancing expenditures in the series production of components with several parallel connected amplifier modules. Another disadvantage is that phase errors (which occur, for example, because of temperature changes or aging) cannot be compensated.

It is therefore an object of the present invention to provide a phase balancing method that permits a simple phasing for several parallel connected amplifier modules.

Another object of the invention is to provide a circuit for implementing the method.

These and other objects and advantages are achieved by the method and apparatus according to the invention, in which an amplifier module is defined as a reference module with a fixed phase, in a first step. In a second and in subsequent steps, the phases of the other amplifier modules are adjusted in pairs relative to the reference module defined in the first step, such that the combined power output from the respective individual amplifier module and the reference module is minimized. In a last step, the phase of the reference module is shifted by 180°.

A circuit according to the invention for balancing the phases of a number of amplifier modules comprises a signal source which is assigned to each amplifier stage. Advantageously, a digital interface exists which is connected with the signal source.

One advantage of the method according to the invention is that phase matching of the amplifier modules to a separate model-type reference module is not required during the manufacturing. The amplifier modules can expediently be transmitter modules in an antenna system.

Another advantage is that phasing can be performed essentially automatically. In addition, the method according to the invention makes it possible to compensate for phase deviations which occur, for example, due to temperature changes or aging or the exchange of an amplifier module.

It is another advantage that the phase balancing can take place in the continuous operation of the amplifier modules.

It is still another advantage of the method according to the invention that the result of the phasing is independent of the reference module selected in the first process step.

In an advantageous embodiment of the invention, the other amplifier modules are switched off before a phase matching between the reference module and an amplifier module. As a result, an optimal matching of the phases between the two modules is achieved.

In another advantageous embodiment of the invention, the phase for each amplifier module is digitally generated and set. As a result, more precise phase values can be set in comparison to an analog generation. In addition, the phase values can be set significantly faster digitally, so that the entire phase balancing can take place more rapidly.

Advantageously, the phase value which minimizes the combined power output from the respective individual amplifier module and the reference module is stored. As a result, the phase values can again be written into the amplifier modules, at a new system start of the amplifier modules. The phase value can of course also be written into the signal source assigned to the amplifier stage.

Other objects, advantages and novel features of the present invention will become apparent from the following detailed description of the invention when considered in conjunction with the accompanying drawings.

DETAILED DESCRIPTION OF THE DRAWINGS

A signal source M1–Mn is assigned to each amplifier module VM1–VMn. As shown in the figures, the signal sources M1–Mn (corresponding to the FIG. 2 signal sources formed by phase shifters No.1–No.n and associated RF Signal Source and Splitter) are each connected with the input IN of an amplifier modules VM1–VMn (corresponding to the FIG. 2 Amplifiers 1–n) The outputs OUT of the amplifier modules VM1–VM6 are connected with an adder SUM (corresponding to the FIG. 2 Combiner). In the adder SUM, the power output of the individual amplifier modules VM1–VM6 are combined.

In the method according to the invention, the amplifier modules are balanced in pairs. During the balancing, all modules other than the two modules that are to be matched, are switched off.

The phase of an arbitrary amplifier module (hereinafter called reference module), is initialized and kept constant during the balancing procedure. The other modules are connected individually and expediently successively.

An example of a sequence of a balancing in the case of 6 amplifier modules will be illustrated in the following table. In this example, the amplifier module VM1 is selected as the reference module.

|  | VM1 | VM2 | VM3 | VM4 | VM5 | VM6 |
| --- | --- | --- | --- | --- | --- | --- |
| 1st Step | on | on | x | x | x | x |
| 2nd Step | on | x | on | x | x | x |
| 3rd Step | on | x | x | on | x | x |
| 4th Step | on | x | x | x | on | x |
| 5th Step | on | x | x | x | x | on |

Figure 1:
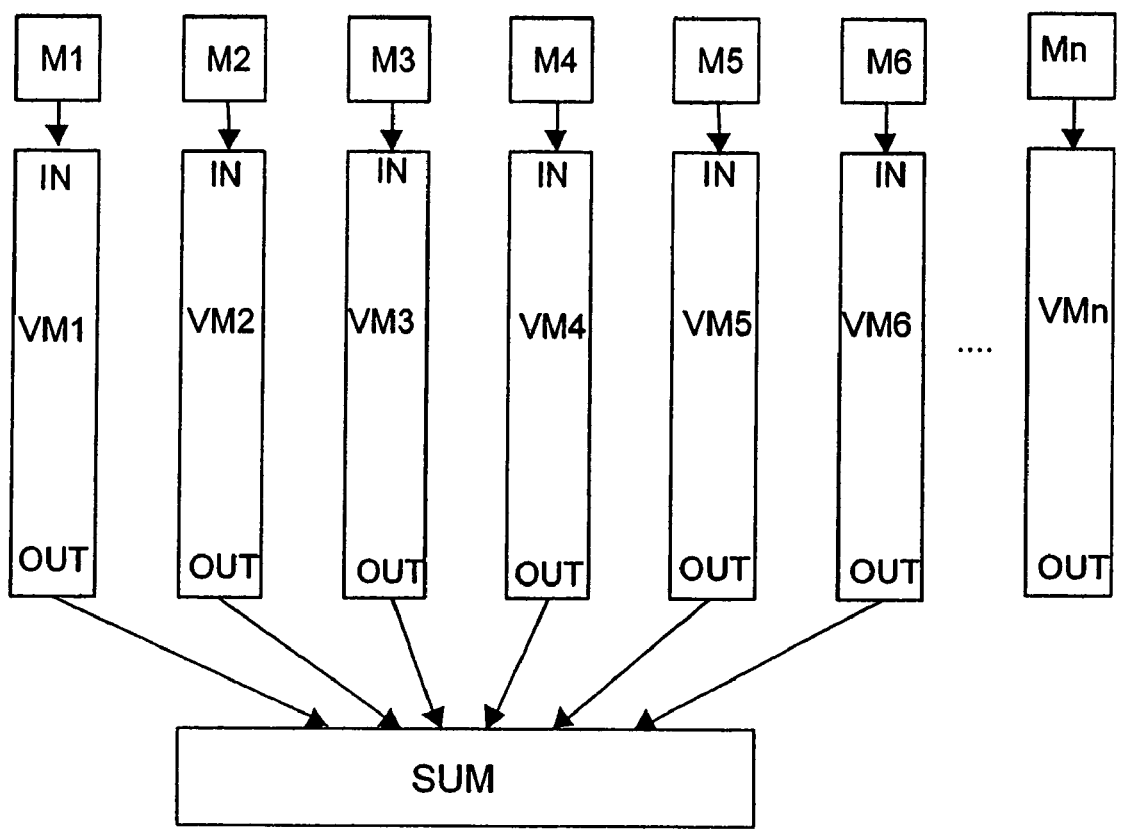
FIG. 1 shows the circuit according to the invention.
Figure 2:
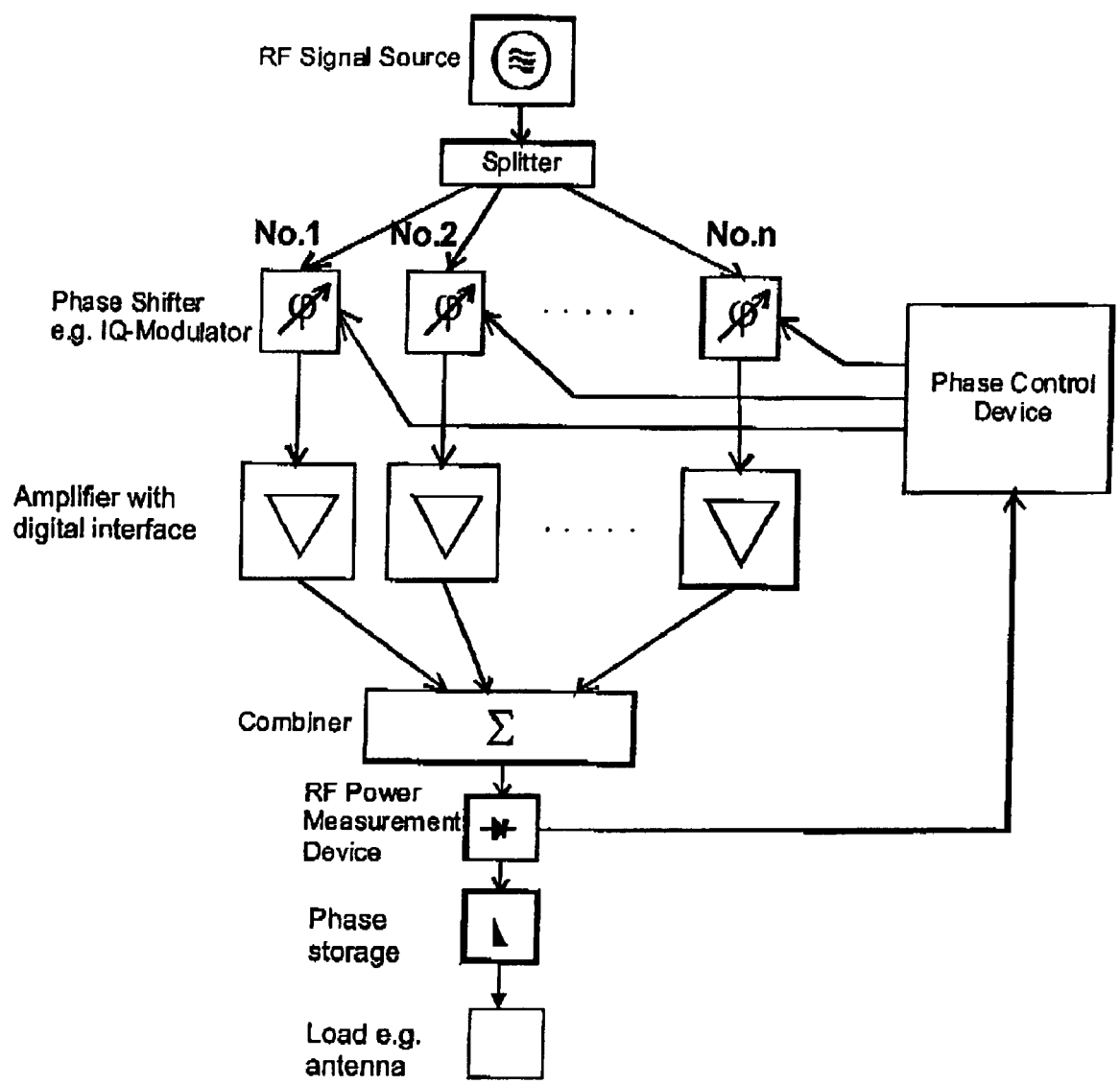
FIG. 2 shows the circuit of FIG. 1 in greater detail.

The phase of the respective second amplifier module VM2–VM6 is increased (in FIG. 2, by the Phase Control Device) starting from zero until a power minimum of the output power is measured at the output of the adder (measurement performed in the FIG. 2 RF Power Measurement Device). The pertaining phase value of the corresponding amplifier module VM2–VM6 is then stored (storage performed in the FIG. 2 Phase Storage).

The balancing to the power minimum is more favorable than a balancing to the power maximum because the minimum is much more pronounced by way of the phase adjustment. After conclusion of the phase balancing (that is, after all amplifier modules VM2–VM6 have been matched with the reference module VM1), the phase of the amplifier module VM1 defined as the reference module is shifted by 180°. Subsequently, all amplifier modules are activated.

The method according to the invention can be used in antenna systems with one or more transmitters.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for phase balancing of a plurality of amplifier modules to maximize a combined power output of the amplifier modules, said method comprising:

selecting an amplifier module to be used as a reference module with a fixed phase;

sequentially pairing each other amplifier module of said plurality of amplifier modules with the reference module and adjusting the phase of the other amplifier module such that a combined power output from the other amplifier module and the reference module is minimized, and shifting the phase of the reference module by 180°.

2. The method according to claim 1, wherein, before the phase balancing between the reference module and the other amplifier modules, the other amplifier modules are switched off.

3. The method according to claim 2, wherein the phase for each amplifier module is generated and adjusted digitally.

4. The method according to claim 2, wherein the phase value which minimizes the combined power output from the respective individual amplifier module and the reference module is stored.

5. Apparatus for balancing the phases of a plurality of amplifier modules, said apparatus comprising:

an adjustable phase signal source assigned to each amplifier stage; wherein, an amplifier module is selected from said plurality, to be used as a reference module;

each amplifier module in said plurality other than the selected amplifier module is sequentially paired with the reference module, and the phase of the other amplifier module is adjusted so that combined power output from the other amplifies module and the reference module is minimized; and the phase of the reference module is shifted 180°.

6. The apparatus according to claim 5, wherein a digital phase control device is connected with the signal source.

* * * * *